United States Patent
Toda et al.

(10) Patent No.: US 11,796,404 B2
(45) Date of Patent: Oct. 24, 2023

(54) STRAIN GAUGE

(71) Applicant: MINEBEA MITSUMI Inc., Nagano (JP)

(72) Inventors: Shinya Toda, Shizuoka (JP); Eiji Misaizu, Kanagawa (JP); Kosuke Kitahara, Kanagawa (JP)

(73) Assignee: MINEBEA MITSUMI Inc., Nagano (JP)

( * ) Notice: Subject to any disclaimer, the term of this patent is extended or adjusted under 35 U.S.C. 154(b) by 431 days.

(21) Appl. No.: 17/041,704

(22) PCT Filed: Mar. 29, 2019

(86) PCT No.: PCT/JP2019/013983
§ 371 (c)(1),
(2) Date: Sep. 25, 2020

(87) PCT Pub. No.: WO2019/189752
PCT Pub. Date: Oct. 3, 2019

(65) Prior Publication Data
US 2021/0131886 A1 May 6, 2021

(30) Foreign Application Priority Data
Mar. 29, 2018 (JP) .................. 2018-065346

(51) Int. Cl.
*G01L 1/00* (2006.01)
*G01L 1/22* (2006.01)
(Continued)

(52) U.S. Cl.
CPC .......... *G01L 1/2287* (2013.01); *H05K 1/0296* (2013.01); *H05K 1/0393* (2013.01); *H05K 1/167* (2013.01); *H05K 2201/10151* (2013.01)

(58) Field of Classification Search
CPC .. G01L 1/2287; H05K 1/0296; H05K 1/0393; H05K 1/167; H05K 2201/10151
See application file for complete search history.

(56) References Cited

U.S. PATENT DOCUMENTS

| | | |
|---|---|---|
| 4,432,247 A | 2/1984 | Takeno et al. |
| 4,649,752 A | 3/1987 | Turner |

(Continued)

FOREIGN PATENT DOCUMENTS

| | | |
|---|---|---|
| CN | 101614522 | 12/2009 |
| CN | 104713469 | 6/2015 |

(Continued)

OTHER PUBLICATIONS

Office Action dated Apr. 12, 2022 with respect to the corresponding Japanese patent application No. 2018-065346.

(Continued)

*Primary Examiner* — Max H Noori
(74) *Attorney, Agent, or Firm* — IPUSA, PLLC

(57) ABSTRACT

A strain gauge includes a flexible substrate, a resistor formed of material containing at least one from among chromium and nickel, on or above the substrate, and a pair of electrodes electrically connected to the resistor. Each electrode includes a plurality of first patterns that are juxtaposed at predetermined intervals and that are electrically connected to each other. A plurality of second patterns of which longitudinal directions are toward a same direction as a longitudinal direction of each of the first patterns are disposed between opposing electrodes.

18 Claims, 4 Drawing Sheets

(51) Int. Cl.
*H05K 1/02* (2006.01)
*H05K 1/03* (2006.01)
*H05K 1/16* (2006.01)

(56) References Cited

U.S. PATENT DOCUMENTS

| | | | |
|---|---|---|---|
| 4,677,413 | A | 6/1987 | Zandman et al. |
| 4,747,456 | A | 5/1988 | Kitagawa et al. |
| 4,758,816 | A | 7/1988 | Blessing et al. |
| 5,079,535 | A | 1/1992 | Neuman et al. |
| 5,328,551 | A | 7/1994 | Kovacich |
| 5,914,168 | A | 6/1999 | Wakamatsu et al. |
| 11,499,876 | B2 * | 11/2022 | Sato ................ H01C 7/003 |
| 2001/0024865 | A1 * | 9/2001 | Kretschmann ...... G01L 9/0055 438/478 |
| 2004/0124018 | A1 | 7/2004 | Yanagi |
| 2004/0140868 | A1 | 7/2004 | Takeuchi et al. |
| 2005/0155435 | A1 | 7/2005 | Ziebart et al. |
| 2005/0163461 | A1 | 7/2005 | Ziebart et al. |
| 2005/0188769 | A1 | 9/2005 | Moelkner et al. |
| 2005/0276990 | A1 | 12/2005 | Kohara et al. |
| 2008/0170982 | A1 | 7/2008 | Zhang et al. |
| 2012/0247220 | A1 | 10/2012 | Inamori |
| 2015/0169091 | A1 | 6/2015 | Ho et al. |
| 2016/0290586 | A1 | 10/2016 | Shido et al. |
| 2016/0370210 | A1 * | 12/2016 | Kapusta ................ G01K 7/16 |
| 2018/0217016 | A1 | 8/2018 | Inamori et al. |
| 2021/0312846 | A1 * | 10/2021 | Atkinson ........... G09G 3/3406 |
| 2022/0022815 | A1 * | 1/2022 | Tessarolo ........... A61B 5/6804 |

FOREIGN PATENT DOCUMENTS

| | | |
|---|---|---|
| CN | 105627905 | 6/2016 |
| CN | 105696139 | 6/2016 |
| CN | 106568539 | 4/2017 |
| EP | 0171467 | 2/1986 |
| EP | 0725392 | 8/1996 |
| JP | S58-118930 | 7/1983 |
| JP | S58-208633 | 12/1983 |
| JP | S61-97737 U | 6/1986 |
| JP | S61-176803 | 8/1986 |
| JP | S62-190402 | 8/1987 |
| JP | H01-309272 | 12/1989 |
| JP | H06-300649 | 10/1994 |
| JP | H06-307950 | 11/1994 |
| JP | H07-306002 | 11/1995 |
| JP | H08-102163 | 4/1996 |
| JP | H09-016941 | 1/1997 |
| JP | H10-270201 | 10/1998 |
| JP | 2001-338382 | 12/2001 |
| JP | 2004-072715 | 3/2004 |
| JP | 2004-205410 | 7/2004 |
| JP | 2007-173544 | 7/2007 |
| JP | 2008-157830 | 7/2008 |
| JP | 2015-031633 | 2/2015 |
| JP | 2016-074934 | 5/2016 |
| JP | 2016-136605 | 7/2016 |
| JP | 2017-067764 | 4/2017 |
| JP | 2017-101983 | 6/2017 |
| WO | 2015/098822 | 7/2015 |

OTHER PUBLICATIONS

Office Action dated Apr. 26, 2022 with respect to the corresponding Chinese patent application No. 201980022146.7.
Office Action dated Oct. 18, 2022 with respect to the corresponding Japanese patent application No. 2018-065346.
C. Rebholz et al., "Structure, mechanical and tribological properties of nitrogen-containing chromium coatings prepared by reactive magnetron sputtering", Surface and Coatings Technology, vol. 115, Issues 2-3, pp. 222-229, 1999.
Kyoritsu Shuppan Co., Ltd., "Dictionary of Crystal Growth", 1st Edition, 1st Printing, p. 50-51, Jul. 25, 2001 (With Partial Translation).
Haruhiro Kobayashi, Nikkan Kogyo Shimbun, Ltd., "Sputter thin film—Fundamentals and Applications", 1st Edition, 1st Printing,p. 102-107,Feb. 25, 1993 (With Partial Translation).
International Search Report for PCT/JP2019/013983 dated Jun. 25, 2019.
International Search Report for PCT/JP2018/039716 dated Jan. 15, 2019.
Office Action dated Jun. 2, 2021 with respect to the corresponding Chinese Patent Application No. 201880083538.X.
Extended European Search Report dated Jun. 22, 2021 with respect to the corresponding European Patent Application No. 18871642.7.
Office Action dated Dec. 7, 2021 with respect to the corresponding Japanese patent application No. 2017-208195.
Office Action dated Jan. 13, 2022 with respect to the corresponding Chinese patent application No. 201880083538.X.
Office Action dated Sep. 6, 2022 with respect to the related Japanese patent application No. 2017-208195.
Office Action dated Apr. 13, 2022 with respect to related U.S. Appl. No. 16/757,869.

* cited by examiner

STRAIN GAUGE

TECHNICAL FIELD

The present invention relates to a strain gauge.

BACKGROUND ART

A strain gauge is known to be attached to a measured object to detect strain of the measured object. The strain gauge includes a resistor for detecting strain, and as a resistor material, for example, material including Cr (chromium) or Ni (nickel) is used. For example, both end portions of the resistor are used as electrodes, and a lead wire for external connection, or the like is joined to the electrodes, with solder, which allows signals with respect to an electronic component to be input and output (see, for example, Patent document 1).

CITATION LIST

[Patent Document]
[Patent document 1] Japanese Unexamined Patent Application Publication No. 2016-74934

SUMMARY

However, when the strain gauge is miniaturized, connection with the lead wire or the like, using solder becomes difficult because the electrodes are reduced in size in accordance with the miniaturized strain gauge. For this reason, with use of a bonding material (for example, an anisotropic conductive film) other than solder, methods of joining a miniaturized electrode to a flexible substrate or the like have been attempted in recent years, and join reliability of the miniaturized electrode and an object to be joined is required to be secured.

In view of the point described above, an object of the present invention is to achieve an electrode structure that can secure join reliability with respect to an object to be joined, even when a strain gauge including a resistor formed on or above a flexible substrate is miniaturized.

A strain gauge includes a flexible substrate; a resistor formed of material containing at least one from among chromium and nickel, on or above the substrate; and a pair of electrodes electrically connected to the resistor. Each electrode includes a plurality of first patterns that are juxtaposed at predetermined intervals and that are electrically connected to each other. A plurality of second patterns of which longitudinal directions are toward a same direction as a longitudinal direction of each of the first patterns are disposed between opposing electrodes.

Effects of the Invention

According to the disclosed technique, an electrode structure that can secure join reliability with respect to an object to be joined is achieved, even when a strain gauge including a resistor formed on or above a flexible substrate is miniaturized.

DESCRIPTION OF EMBODIMENTS

One or more embodiments will be hereinafter described with reference to the drawings. In each figure, the same numerals denote the same components; accordingly, duplicative explanations may be omitted.

First Embodiment

Figure 1:
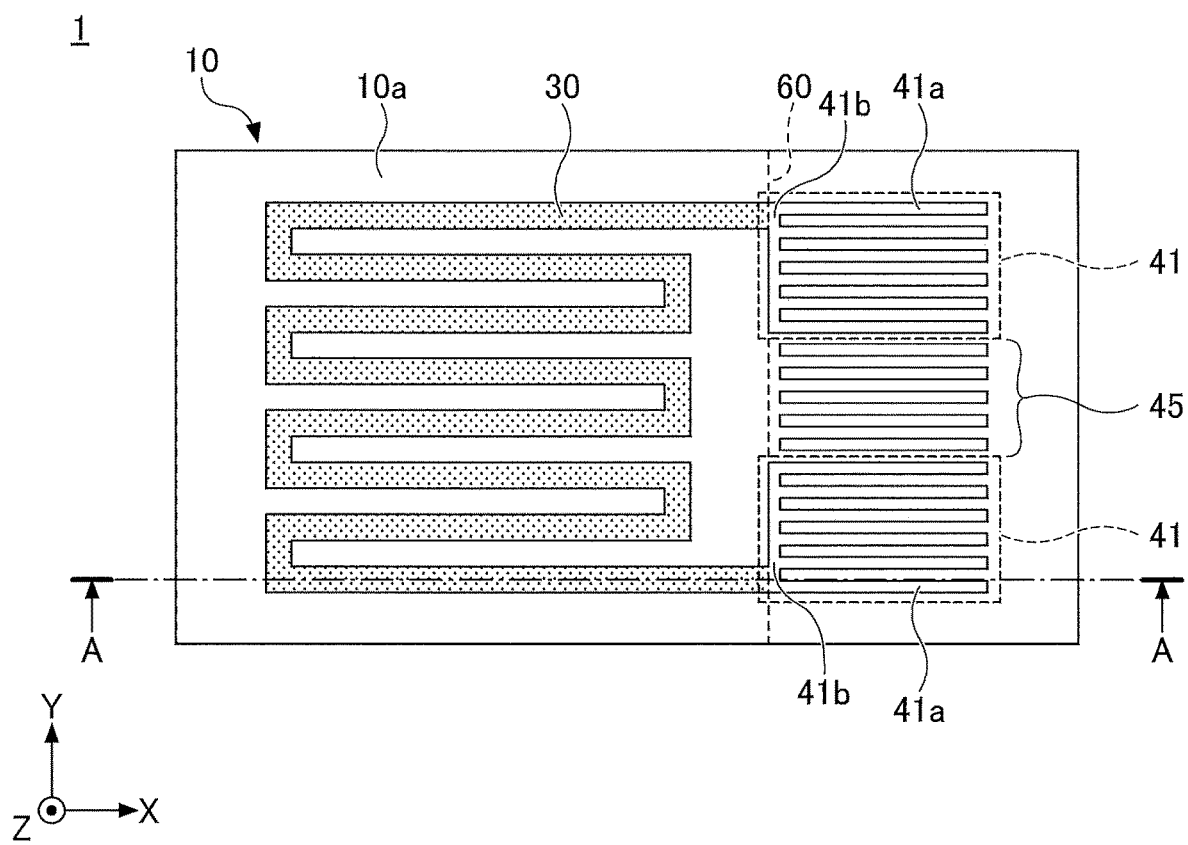
FIG. 1 is a plan view of an example of a strain gauge according to a first embodiment.
Figure 2:
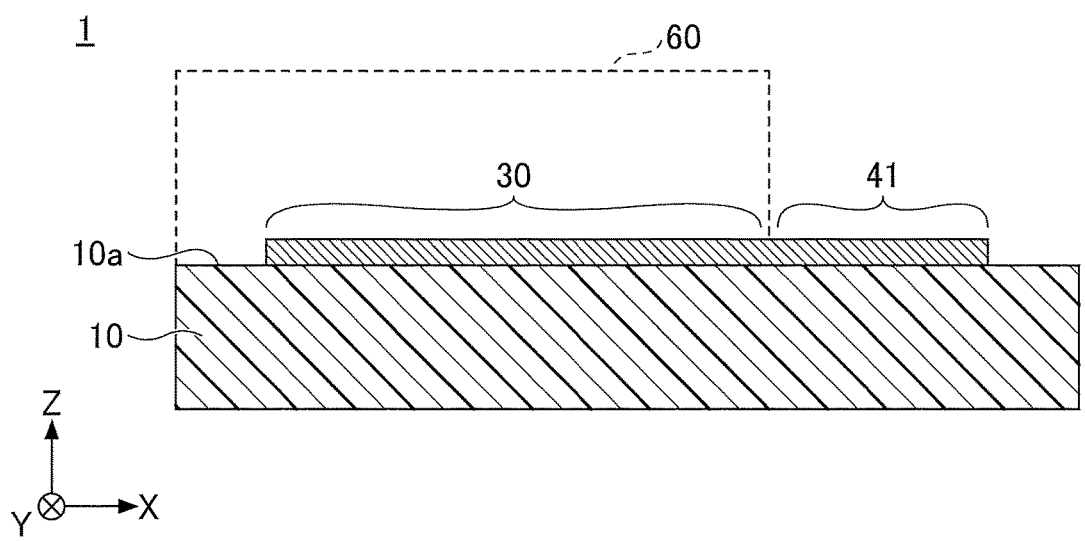
FIG. 2 is a cross-sectional view (part 1) of an example of the strain gauge according to the first embodiment.

FIG. 1 is a plan view of an example of a strain gauge according to a first embodiment. FIG. 2 is a cross-sectional view of an example of the strain gauge according to the first embodiment, and illustrates a cross section taken along the A-A line in FIG. 1. Referring to FIGS. 1 and 2, the strain gauge 1 includes a substrate 10, a resistor 30, terminal sections 41, and dummy patterns 45.

Note that in the present embodiment, for the sake of convenience, with respect to the strain gauge 1, the side of the substrate 10 where the resistor 30 is provided is referred to as an upper side or one side; and the side of the substrate 10 where the resistor 30 is not provided is referred to as a lower side or another side. Further, for each component, the surface on the side where the resistor 30 is provided is referred to as one surface or an upper surface; and the surface on the side where the resistor 30 is not provided is referred to as another surface or a lower surface. However, the strain gauge 1 can be used in a state of being upside down, or be disposed at any angle. Further, a plan view means that an object is viewed from a direction normal to an upper surface 10a of the substrate 10, and a planar shape refers to a shape of an object when viewed from the direction normal to the upper surface 10a of the substrate 10.

The substrate 10 is a member that is a base layer for forming the resistor 30 or the like and is flexible. The thickness of the substrate 10 is not particularly restricted, and can be appropriately selected for any purpose. For example, such a thickness can be approximately between 5 μm and 500 μm. In particular, when the thickness of the substrate 10 is between 5 μm and 200 μm, it is preferable in terms of strain transfer from a flexure element surface that is bonded to a lower surface of the substrate 10 via an adhesive layer or the like; and dimensional stability with respect to environment, and when the thickness is 10 μm or more, it is further preferable in terms of insulation.

The substrate 10 can be formed of an insulating resin film such as a PI (polyimide) resin, an epoxy resin, a PEEK (polyether ether ketone) resin, a PEN (polyethylene naphthalate) resin, a PET (polyethylene terephthalate) resin, a PPS (polyphenylene sulfide) resin, or a polyolefin resin. Note that the film refers to a flexible member having a thickness of about 500 μm or less.

Here, the "formed of an insulating resin film" is not intended to preclude the substrate 10 from containing fillers, impurities, or the like in the insulating resin film. The substrate 10 may be formed of, for example, an insulating resin film containing fillers such as silica or alumina.

The resistor 30 is a thin film formed in a predetermined pattern and is a sensitive section where resistance varies according to strain. The resistor 30 may be formed directly on the upper surface 10a of the substrate 10, or be formed above the upper surface 10a of the substrate 10, via other layer(s). Note that in FIG. 1, for the sake of convenience, the resistor 30 is illustrated in a crepe pattern.

The resistor 30 can be formed of, for example, material including Cr (chromium); material including Ni (nickel); or material including both of Cr and Ni. In other words, the resistor 30 can be formed of material including at least one from among Cr and Ni. An example of the material including Cr includes a Cr composite film. An example of the material including Ni includes Cu—Ni (copper nickel). An example of the material including both of Cr and Ni includes Ni—Cr (nickel chromium).

Here, the Cr composite film is a composite film of Cr, CrN, $Cr_2N$, and the like. The Cr composite film may include incidental impurities such as chromium oxide.

The thickness of the resistor 30 is not particularly restricted, and can be appropriately selected for any purpose. The thickness can be, for example, approximately between 0.05 μm and 2 μm. In particular, when the thickness of the resistor 30 is 0.1 μm or more, it is preferable in terms of improvement in crystallinity (e.g., crystallinity of α-Cr) of a crystal that constitutes the resistor 30, and when the thickness of the resistor 30 is 1 μm or less, it is further preferable in terms of reduction in cracks of a given film caused by internal stress of the film that constitutes the resistor 30, or reduction in warp in the substrate 10.

For example, when the resistor 30 is the Cr composite film, the resistor is formed with α-Cr (alpha-chromium) as the main component having a stable crystalline phase, so that stability of the gauge characteristics can be improved. Additionally, when the resistor 30 is formed with α-Cr as the main component, a gauge factor of the strain gauge 1 can be 10 or more, as well as a gauge factor temperature coefficient TCS and temperature coefficient of resistance TCR being able to be each in the range of from −1000 ppm/t to +1000 ppm/t. Here, a main component means that a target substance is 50% by weight or more of total substances that constitute the resistor. The resistor 30 preferably includes α-Cr at 80% by weight or more, from the viewpoint of improving the gauge characteristics. Note that α-Cr is Cr having a bcc structure (body-centered cubic structure).

The terminal sections 41 are respectively electrically connected to both end portions of the resistor 30. The terminal sections 41 are a pair of electrodes for externally outputting a change in a resistance value of the resistor 30 in accordance with strain, where for example, a flexible substrate for external connection, or the like is joined via an anisotropic conductive film (ACF). For example, the resistor 30 extends from one of the terminal sections 41, with zigzagged hairpin turns, to be connected to another terminal section 41.

Each terminal section 41 includes a plurality of patterns 41a in each of which the X direction is the longitudinal direction of the pattern, and that are juxtaposed in the Y direction and at predetermined intervals. Each terminal section 41 includes a pattern 41b in which the Y direction is the longitudinal direction of the pattern. The patterns 41a are electrically connected to each other, via the pattern 41b.

One end portion of each pattern 41a is connected at one side of the pattern 41b in the longitudinal direction of the pattern 41b. Another end portion of each pattern 41a is open. Each pattern 41a has any width, and for example, the width of the pattern 41a can be set to be narrower than the width of the resistor 30.

One end portion of each pattern 41b is connected to a given end portion of the resistor 30. However, the one end portion of the pattern 41b is not necessarily to be connected to the end portion of the resistor 30. The end portion of the resistor 30 may be connected at any location of the pattern 41b. For example, another end portion of the pattern 41b may be connected to the end portion of the resistor 30. Alternatively, the pattern 41b may be connected to the end portion of the resistor 30, at any location between the one end portion and another end portion of the pattern 41b. Each pattern 41b has any width, and for example, the width of the pattern 41b can be set to be narrower than the width of the resistor 30.

Between opposing terminal sections 41 that are disposed in the Y direction, the electrically floating plurality of dummy patterns 45 in each of which the X direction is the longitudinal direction of the dummy pattern are juxtaposed in the Y direction and at predetermined intervals.

More specifically, the plurality of dummy patterns 45 of which the longitudinal directions are toward the same direction as the longitudinal direction of each pattern 41a are disposed with being interposed between patterns 41a opposite each other, the patterns 41a opposite each other being from among the plurality of patterns 41a that constitute the one terminal section 41 and the plurality of patterns 41a that constitute the another terminal section 41. The longitudinal direction of each of the patterns 41a and the dummy patterns 45 can be, for example, parallel to the grid direction of the resistor 30, but is not limited thereto. The width of each dummy pattern 45 is the same as the width of each pattern 41a.

The plurality of dummy patterns 45, as well as the plurality of patterns 41a that constitute the one terminal section 41; and the plurality of patterns 41a that constitute the another terminal section 41, are ranged in the Y direction and at regular intervals. In other words, a space between patterns 41a that are next to each other; a space between dummy patterns 45 that are next to each other; and a space between a given pattern 41a and a given dummy pattern 45 that are next to each other, are identical. The width of each pattern 41a may be different from the space between patterns 41a. The space between patterns 41a is desirably between 0.5 and 1.5 times of the width of the pattern 41a, in terms of uniformity of thermal distribution and pressure distribution. The space between patterns 41a is desirably 1 times the width of the pattern 41a, in terms of further uniformity of thermal distribution and pressure distribution.

Note that for the sake of convenience, the resistor 30, the terminal sections 41, and the dummy patterns 45 are expressed by different numerals. However, the resistor, the terminal sections, and the dummy patterns can be integrally formed of the same material, in the same process.

A cover layer 60 (insulating resin layer) may be provided on and above the upper surface 10a of the substrate 10, such that the resistor 30 is coated and the terminal sections 41 and the dummy patterns 45 are exposed. With the cover layer 60 being provided, mechanical damage, and the like can be prevented from occurring in the resistor 30. Additionally, with the cover layer 60 being provided, the resistor 30 can be protected against moisture, and the like. Note that the cover layer 60 may be provided to cover all portions except for the terminal sections 41 and the dummy patterns 45.

The cover layer 60 can be formed of an insulating resin such as a PI resin, an epoxy resin, a PEEK resin, a PEN resin, a PET resin, a PPS resin, or a composite resin (e.g., a silicone resin or a polyolefin resin). The cover layer 60 may contain fillers or pigments. The thickness of the cover layer 60 is not particularly restricted, and can be appropriately selected for any purpose. For example, the thickness may be approximately between 2 μm and 30 μm.

In order to manufacture the strain gauge 1, first, the substrate 10 is prepared and the resistor 30, the terminal sections 41, and the dummy patterns 45 each of which has the planar shape illustrated in FIG. 1 are formed on the upper surface 10a of the substrate 10. The material and thickness for each of the resistor 30 and the terminal sections 41, and the dummy patterns 45 are the same as the material and thickness described above. The resistor 30, the terminal sections 41, and the dummy patterns 45 can be integrally formed of the same material.

The resistor 30, the terminal sections 41, and the dummy patterns 45 can be formed, for example, such that a raw material capable of forming the resistor 30, the terminal sections 41, and the dummy patterns 45 is a target to be deposited by magnetron sputtering, and such that patterning is performed by photolithography. Instead of magnetron sputtering, the resistor 30, the terminal sections 41, and the dummy patterns 45 may be deposited by reactive sputtering, vapor deposition, arc ion plating, pulsed laser deposition, or the like.

From the viewpoint of stabilizing the gauge characteristics, before depositing the resistor 30, the terminal sections 41, and the dummy patterns 45, preferably, as a base layer, a functional layer having a film thickness that is approximately between 1 nm and 100 nm is vacuum-deposited on the upper surface 10a of the substrate 10, by conventional sputtering, for example. Note that, after forming the resistor 30, the terminal sections 41, and the dummy patterns 45 on the entire upper surface of the functional layer, the functional layer, as well as the resistor 30, the terminal sections 41, and the dummy patterns 45, are patterned to have the planar shape illustrated in FIG. 1, by photolithography.

In the present application, the functional layer refers to a layer that has a function of promoting crystal growth of the resistor 30 that is at least an upper layer. The functional layer preferably further has a function of preventing oxidation of the resistor 30 caused by oxygen and moisture included in the substrate 10, as well as a function of improving adhesion between the substrate 10 and the resistor 30. The functional layer may further have other functions.

The insulating resin film that constitutes the substrate 10 contains oxygen and moisture. In this regard, particularly when the resistor 30 includes Cr, it is effective for the functional layer to have a function of preventing oxidation of the resistor 30, because Cr forms an autoxidized film.

The material of the functional layer is not particularly restricted as long as it is material having a function of promoting crystal growth of the resistor 30 that is at least an upper layer. Such material can be appropriately selected for any purpose, and includes one or more types of metals selected from the group consisting of, for example, Cr (chromium), Ti (titanium), V (vanadium), Nb (niobium), Ta (tantalum), Ni (nickel), Y (yttrium), Zr (zirconium), Hf (hafnium), Si (silicon), C (carbon), Zn (zinc), Cu (copper), Bi (bismuth), Fe (iron), Mo (molybdenum), W (tungsten), Ru (ruthenium), Rh (rhodium), Re (rhenium), Os (osmium), Ir (iridium), Pt (platinum), Pd (palladium), Ag (silver), Au (gold), Co (cobalt), Mn (manganese), and Al (aluminum); an alloy of any metals from among the group; or a compound of any metal from among the group.

Examples of the above alloy include FeCr, TiAl, FeNi, NiCr, CrCu, and the like. Examples of the above compound include TiN, TaN, $Si_3N_4$, $TiO_2$, $Ta_2O_5$, $SiO_2$, and the like.

The functional layer can be vacuum-deposited by, for example, conventional sputtering in which a raw material capable of forming the functional layer is the target and in which an Ar (argon) gas is supplied to a chamber. By using conventional sputtering, the functional layer is deposited while the upper surface 10a of the substrate 10 is etched with Ar. Thus, a deposited amount of film of the functional layer is minimized and thus an effect of improving adhesion can be obtained.

However, this is an example of a method of depositing the functional layer, and the functional layer may be deposited by other methods. For example, as such a method, before depositing the functional layer, the upper surface 10a of the substrate 10 is activated by plasma treatment using Ar, etc. or the like to thereby obtain the effect of improving the adhesion; subsequently, the functional layer may be vacuum-deposited by magnetron sputtering.

A combination of the material of the functional layer; and the material of the resistor 30, the terminal sections 41, and the dummy patterns 45 is not particularly restricted, and can be appropriately selected for any purpose. For example, Ti is used for the functional layer, and a Cr composite film formed with α-Cr (alpha-chromium) as the main component can be deposited as the resistor 30, the terminal sections 41, and the dummy patterns 45.

In this case, the resistor 30, the terminal sections 41, and the dummy patterns 45 can be deposited by, for example, magnetron sputtering in which a raw material capable of forming the Cr composite film is the target and in which an Ar gas is supplied to a chamber. Alternatively, the resistor 30, the terminal sections 41, and the dummy patterns 45 may be deposited by reactive sputtering in which pure Cr is the target and in which an appropriate amount of nitrogen gas, as well as an Ar gas, are supplied to a chamber.

In such methods, a growth face of the Cr composite film is defined by the functional layer formed of Ti, and a Cr composite film that is formed with α-Cr as the main component having a stable crystalline structure can be deposited. Also, Ti that constitutes the functional layer is diffused into the Cr composite film, so that the gauge characteristics are improved. For example, the gauge factor of the strain gauge 1 can be 10 or more, as well as the gauge factor temperature coefficient TCS and temperature coefficient of resistance TCR being able to be each in the range of from −1000 ppm/° C. to +1000 ppm/° C. Note that, when the functional layer is formed of Ti, the Cr composite film may include Ti or TiN (titanium nitride).

Note that when the resistor 30 is a Cr composite film, the functional layer formed of Ti includes all functions being a function of promoting crystal growth of the resistor 30; a function of preventing oxidation of the resistor 30 caused by oxygen or moisture contained in the substrate 10; and a function of improving adhesion between the substrate 10 and the resistor 30. Instead of Ti, when the functional layer is formed of Ta, Si, Al, or Fe, the functional layer also includes the same functions.

As described above, with the functional layer being provided in the lower layer of the resistor 30, the crystal growth of the resistor 30 can be promoted and thus the resistor 30 having a stable crystalline phase can be fabricated. As a result, with respect to the strain gauge 1, the stability of the gauge characteristics can be improved. Also, the material that constitutes the functional layer is diffused into the resistor 30, so that the gauge characteristics of the strain gauge 1 can be thereby improved.

After forming the resistor 30, the terminal sections 41, and the dummy patterns 45, the cover layer 60 with which the resistor 30 is coated and that exposes the terminal sections 41 and the dummy patterns 45 is provided on and above the upper surface 10a of the substrate 10, as necessary, so that the strain gauge 1 is completed. For example, the cover layer 60 can be fabricated, such that a thermosetting insulating resin film in a semi-cured state is laminated on the upper surface 10a of the substrate 10, and such that the resistor 30 is coated therewith and the terminal sections 41 and the dummy patterns 45 are exposed; subsequently, heat is added and curing is performed. The cover layer 60 may be formed, such that a thermosetting insulating resin that is liquid or paste-like is applied to the upper surface 10a of the substrate 10, and such that the resistor 30 is coated therewith and the terminal sections 41 and the dummy patterns 45 are exposed; subsequently, heat is added and curing is performed.

Figure 3:
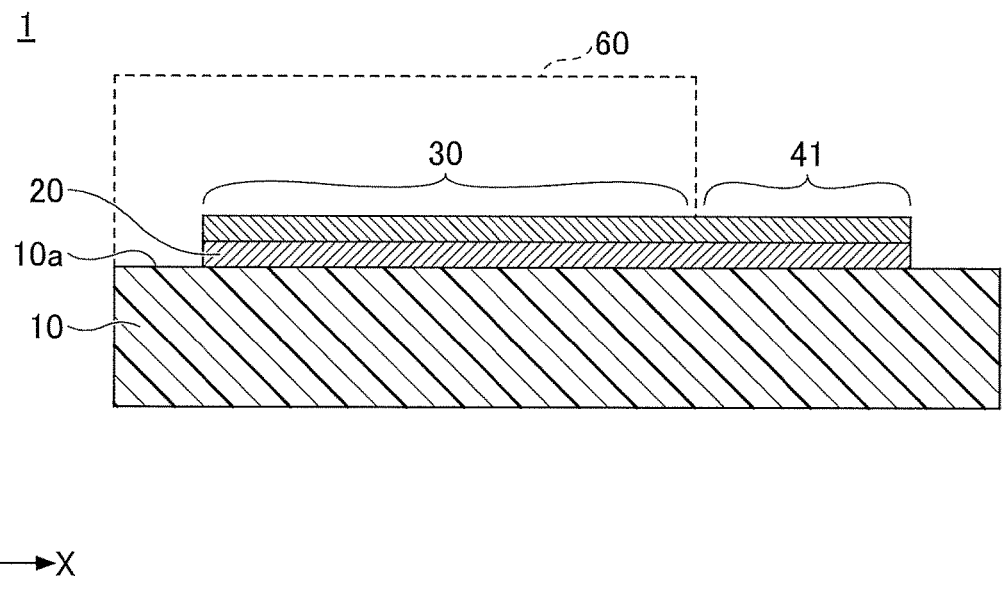
FIG. 3 is a cross-sectional view (part 2) of an example of the strain gauge according to the first embodiment.

Note that when the functional layer, as a base layer of the resistor 30; the terminal sections 41; and the dummy patterns 45, is provided on the upper surface 10a of the substrate 10, the strain gauge 1 has a cross-section shape illustrated in FIG. 3. A layer expressed by the numeral 20 indicates the functional layer. The planar shape of the strain gauge 1 in the case of providing the functional layer 20 is the same as that in FIG. 1.

As described above, for the strain gauge 1, the plurality of dummy patterns 45 are disposed between a pair of terminal sections each of which becomes an electrode. The plurality of dummy patterns 45, as well as the plurality of patterns 41a that constitute one terminal section 41; and the plurality of patterns 41a that constitute another terminal section 41, are ranged in a predetermined direction and at regular intervals, such that the longitudinal directions of the dummy patterns and the patterns are toward the same direction. Further, the width of each dummy pattern 45 is the same as the width of each pattern 41a.

In such a manner, when a flexible substrate or the like are disposed above the pair of terminal sections 41 and the dummy patterns 45, via an anisotropic conductive film, and the pair of terminal sections 41 is joined to the flexible substrate or the like, via the anisotropic conductive film, heat and pressure can be uniformly applied to the anisotropic conductive film. As a result, join reliability in the case of joining the pair of terminal sections 41 to the flexible substrate or the like, via the anisotropic conductive film can be improved.

Further, with at least one end side from among both end portions of each pattern 41a being open, when pressure is applied to the anisotropic conductive film, an escape path for excess anisotropic conductive film can be provided. In this regard, it is preferable.

Note that when the width of each pattern 41a is the same as the width of each dummy pattern 45, and, a given space between patterns 41a that are next to each other; a given space between dummy patterns 45 that are next to each other; and a given space between a given pattern 41a and a given dummy pattern 45 that are next to each other are identical, heat and pressure can be applied with the greatest uniformity to the anisotropic conductive film. Thus, such a configuration is the most excellent. However, even when all of the requirements described above are not met, a constant effect can be obtained.

In other words, each terminal section 41 includes a plurality of patterns 41 that are juxtaposed at predetermined intervals and that are electrically connected to each other. A plurality of dummy patterns 45 are disposed between opposing terminal sections 41, such that the longitudinal directions of the dummy patterns are toward the same direction as the longitudinal direction of each pattern 41a. Thereby, a constant effect of improving join reliability in the case of joining a pair of terminal sections 41 to a flexible substrate or the like, via an anisotropic conductive film can be obtained. The following embodiments also have the same effect as described above.

Modification 1 of the First Embodiment

Modification 1 of the first embodiment will be described using an example of a strain gauge that differs in the electrode pattern described in the first embodiment. Note that in the modification 1 of the first embodiment, explanation for the components that are the same as having been described in the embodiment may be omitted.

Figure 4:
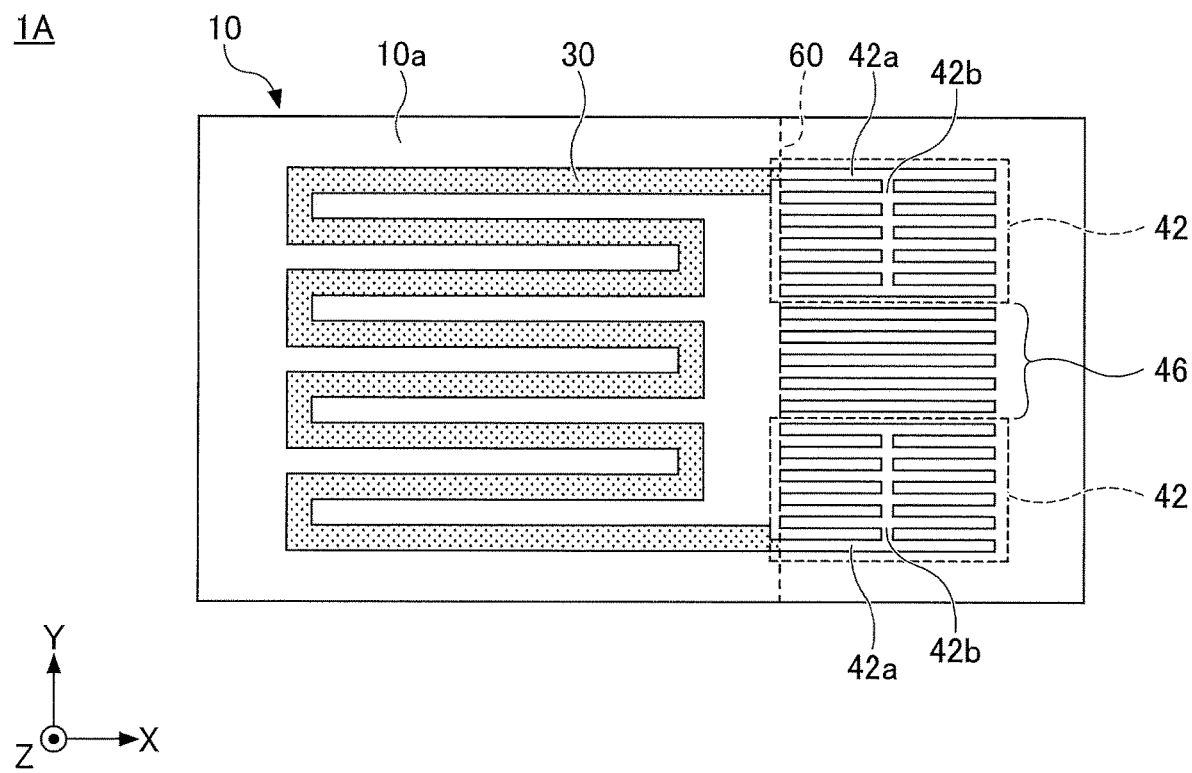
FIG. 4 is a plan view of an example of a strain gauge according to modification 1 of the first embodiment.

FIG. 4 is a plan view of an example of the strain gauge according to the modification 1 of the first embodiment. Referring to FIG. 4, the strain gauge 1A differs from the strain gauge 1 (see FIGS. 1 and 2 and the like) in that terminal sections 42 and dummy patterns 46 are used instead of the terminal sections 41 and the dummy patterns 45.

The terminal sections 42 are electrically connected to both end portions of the resistor 30. The terminal sections 42 are a pair of electrodes for externally outputting a change in a resistance value of the resistor 30 in accordance with strain, where for example, a flexible substrate for external connection, or the like is joined via an anisotropic conductive film. For example, the resistor 30 extends from one of the terminal sections 42, with zigzagged hairpin turns, to be connected to another terminal section 42.

Each terminal section 42 includes a plurality of patterns 42a in each of which the X direction is the longitudinal direction of the pattern, and that are juxtaposed in the Y direction and at predetermined intervals. Each terminal section 42 includes a pattern 42b in which the Y direction is the longitudinal direction of the pattern. The patterns 42a are electrically connected to each other, via the pattern 42b.

A substantially intermediate portion of each pattern 42a is connected to the pattern 42b. One end portion of each outermost pattern 42a is connected to a given end portion of the resistor 30, and the one end portions of the other patterns 42a are open. The other end portions of all of the patterns 42a are open. The width of each pattern 42a is set to be narrower than the width of the resistor 30. Each pattern 42b has any width, and the width of the pattern 42b may be set to be narrower than the width of the resistor 30.

However, the one end portion of each outermost pattern 42a is not necessarily connected to a given end portion of the resistor 30. One end portion of any pattern 42a may be connected to a given end portion of the resistor 30. For example, one end portion of each innermost (dummy pattern 46 side) pattern 42a may be connected to a given end portion of the resistor 30. Alternatively, one end portion of any pattern 42a that is positioned between the outermost pattern and the innermost pattern may be connected to a given end portion of the resistor 30.

Note that the pattern 42b of each terminal section 42 is a pattern that is set by the pattern 41b of the terminal section 41 of which a location has moved from the innermost side (the resistor 30 side) to the intermediate side of the terminal section. The pattern 42b has the same function as the function of electrically connecting a plurality of patterns that are juxtaposed in the Y direction. The pattern 42b of each terminal section 42 may be provided at any location between the innermost (the resistor 30 side) portion and the outermost (side opposite the resistor 30) portion of the pattern in the X direction. The pattern 42b of each terminal section 42 may be provided at the outermost side (side opposite the resistor 30) of the pattern in the X direction.

Between opposing terminal sections 42 that are disposed in the Y direction, the electrically floating dummy patterns 46 in each of which the X direction is the longitudinal direction of the dummy pattern are juxtaposed in the Y direction and at predetermined intervals.

More specifically, the plurality of dummy patterns 46 of which the longitudinal directions are toward the same direction as the longitudinal direction of each pattern 42*a* are disposed with being interposed between patterns 42*a* opposite each other, the patterns 42*a* opposite each other being from among the plurality of patterns 42*a* that constitute one terminal section 42 and the plurality of patterns 42*a* that constitute another terminal section 42. The longitudinal direction of each of the patterns 42 and the dummy patterns 46 can be, for example, parallel to the grid direction of the resistor 30, but is not limited thereto. The width of each dummy pattern 46 is the same as the width of each pattern 42*a*.

The plurality of dummy patterns 46, as well as the plurality of patterns 42*a* that constitute the one terminal section 42; and the plurality of patterns 42*a* that constitute the another terminal section 42, are ranged in the Y direction and at regular intervals. In other words, a given space between patterns 42*a* that are next to each other, a given space between dummy patterns 46 that are next to each other, and a given space between a given pattern 42*a* and a given dummy pattern 46 that are next to each other, are identical.

Note that for the sake of convenience, the resistor 30, the terminal sections 42, and the dummy patterns 46 are expressed by different numerals. However, the resistor, the terminal sections, and the dummy patterns can be integrally formed of the same material, in the same process.

As described above, for the strain gauge 1A, the plurality of dummy patterns 46 are disposed between a pair of terminal sections 42 each of which becomes an electrode. The plurality of dummy patterns 46, as well as the plurality of patterns 42*a* that constitute one terminal section 42; and the plurality of patterns 42*a* that constitute another terminal section 42, are ranged in a predetermined direction and at regular intervals, such that the longitudinal directions of the dummy patterns and the patterns are toward the same direction. Further, the width of each dummy pattern 46 is the same as the width of each pattern 42*a*.

In such a manner, as in the first embodiment, join reliability in the case of joining a pair of terminal sections 42 to a flexible substrate or the like, via an anisotropic conductive film can be improved.

Modification 2 of the First Embodiment

Modification 2 of the first embodiment will be described using an example of a strain gauge that differs in the electrode pattern described in the first embodiment. Note that in the modification 2 of the first embodiment, explanation for the components that are the same as having been described in the embodiment may be omitted.

Figure 5:
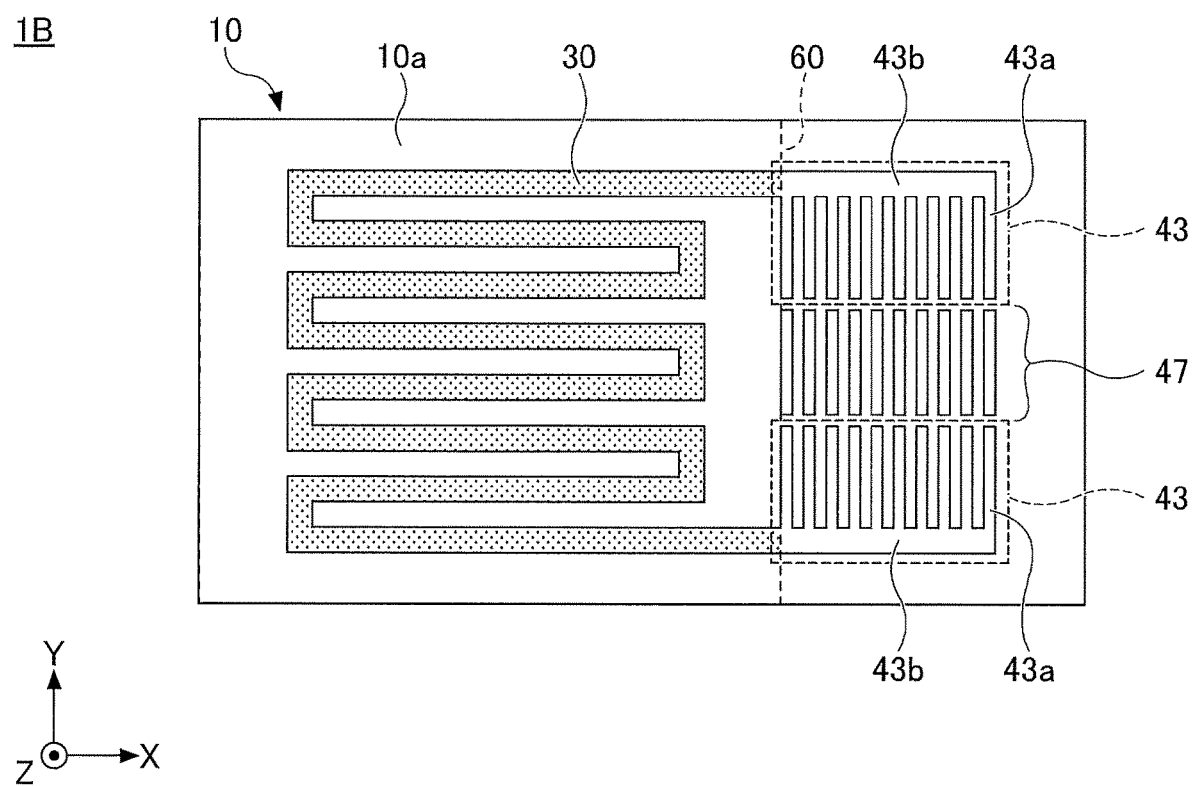
FIG. 5 is a plan view of an example of a strain gauge according to modification 2 of the first embodiment.

FIG. 5 is a plan view of an example of the strain gauge according to the modification 2 of the first embodiment. Referring to FIG. 5, the strain gauge 1B differs from the strain gauge 1 (see FIGS. 1 and 2 and the like) in that terminal sections 43 and dummy patterns 47 are used instead of the terminal sections 41 and the dummy patterns 45.

The terminal sections 43 are respectively electrically connected to both end portions of the resistor 30. The terminal sections 43 are a pair of electrodes for externally outputting a change in a resistance value of the resistor 30 in accordance with strain, where for example, a flexible substrate for external connection, or the like is joined via an anisotropic conductive film. For example, the resistor 30 extends from one of the terminal sections 43, with zigzagged hairpin turns, to be connected to another terminal section 43.

Each terminal section 43 includes a plurality of patterns 43*a* in each of which the Y direction is the longitudinal direction of the pattern, and that are juxtaposed in the X direction and at predetermined intervals. Each terminal section 43 includes a pattern 43*b* in which the X direction is the longitudinal direction of the pattern 43*b*. The patterns 43*a* are electrically connected to each other, via the pattern 43*b*.

One end portion of each pattern 43*a* is connected at one side of the pattern 43*b* in the longitudinal direction of the pattern 43*b*. Another end portion of each pattern 43*a* is open. The width of each pattern 43*a* is set to be narrower than the width of the resistor 30.

One end portion of each pattern 43*b* is connected to a given end portion of the resistor 30. However, the one end portion of the pattern 43*b* is not necessarily connected to the end portion of the resistor 30. The end portion of the resistor 30 may be connected at any location of the innermost (resistor 30 side) pattern 43*a*. The pattern 43*b* has any width. For example, the width of each pattern 43*b* can be set to be narrower than the width of the resistor 30.

Between opposing terminal sections 43 that are disposed in the Y direction, the electrically floating dummy patterns 47 in each of which the Y direction is the longitudinal direction of the dummy pattern are juxtaposed in the X direction and at predetermined intervals.

More specifically, the plurality of dummy patterns 47 of which longitudinal directions are toward the same direction as the longitudinal direction of each pattern 43*a* are disposed with being interposed between end portions of opposing patterns 43*a*, the opposing patterns 43*a* being from among the plurality of patterns 43*a* that constitute one terminal section 43 and the plurality of patterns 43*a* that constitute another terminal section 43. The longitudinal direction of each of the patterns 43*a* and the dummy patterns 47 can be, for example, perpendicular to the grid direction of the resistor 30, but is not limited thereto. The width of each dummy pattern 47 is the same as the width of each pattern 43*a*.

A plurality of sets in each of which one pattern 43*a* that constitutes part of the one terminal section 43; one dummy pattern 47; and one pattern 43*a* that constitutes part of the another terminal section 43 are arranged in line in the Y direction so as not to contact each other, are ranged in the X direction and at predetermined intervals. In other words, each space between sets that are next to each other is identical.

Note that for the sake of convenience, the resistor 30, the terminal sections 43, and the dummy patterns 47 are expressed by different numerals. However, the resistor, the terminal sections, and the dummy patterns can be integrally formed of the same material, in the same process.

As described above, for the strain gauge 1B, the plurality of dummy patterns 47 are disposed between a pair of terminal sections 43 each of which becomes an electrode. The plurality of dummy patterns 47, as well as the plurality of patterns 43*a* that constitute one terminal section 43; and the plurality of patterns 43*a* that constitute another terminal section 43, are ranged in a predetermined direction and at regular intervals, such that the longitudinal directions of the dummy patterns and the patterns are toward the same direction. Further, the width of each dummy pattern 47 is the same as the width of each pattern 43a.

In such a manner, as in the first embodiment, join reliability in the case of joining a pair of terminal sections 43 to a flexible substrate or the like, via the anisotropic conductive film can be improved.

Second Embodiment

The second embodiment will be described using an example of a strain gauge that differs in the electrode pattern described in the first embodiment. Note that in the second embodiment, explanation for the components that are the same as the components that have been described in the embodiment may be omitted.

Figure 6:
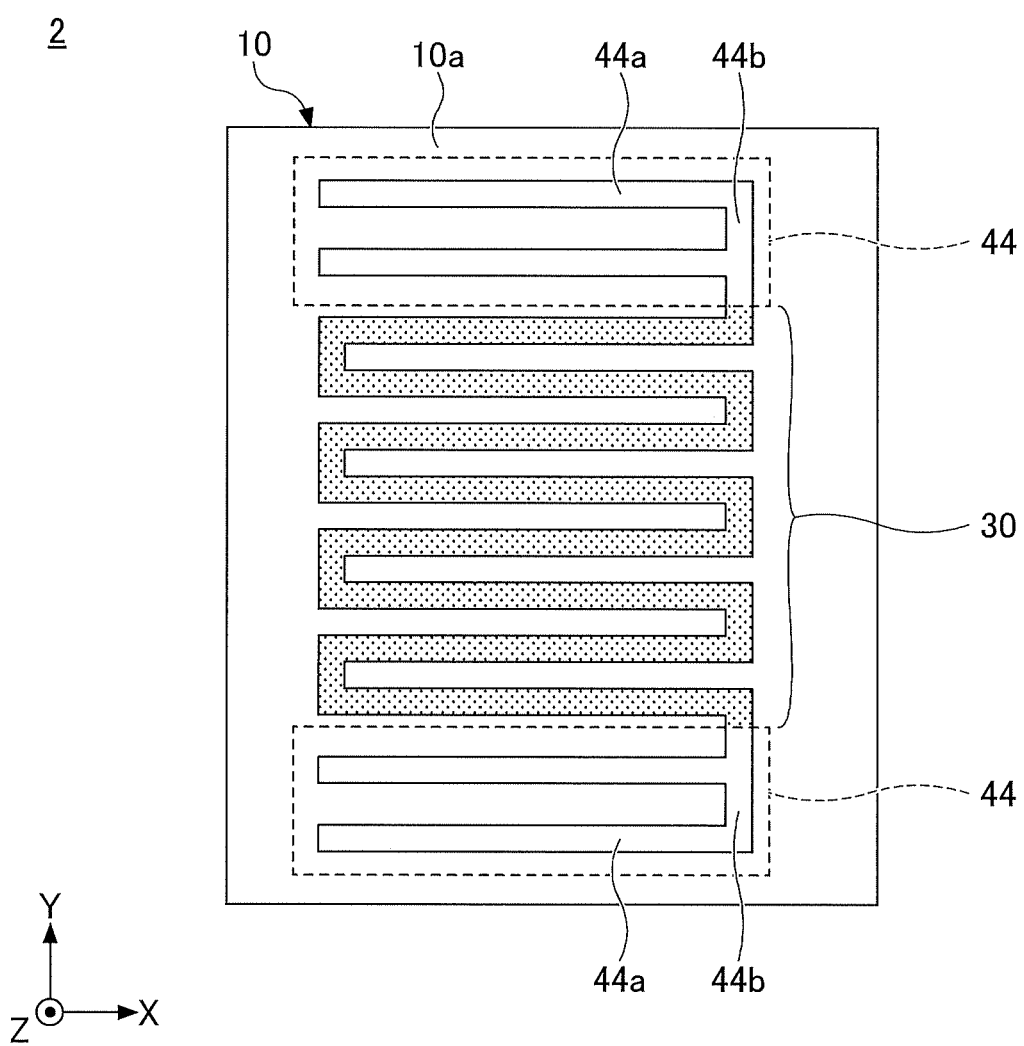
FIG. 6 is a plan view of an example of a strain gauge according to a second embodiment.

FIG. 6 is a plan view of an example of the strain gauge according to the second embodiment. Referring to FIG. 6, the strain gauge 2 differs from the strain gauge 1 (see FIGS. 1 and 2 and the like) in that terminal sections 44 are used instead of the terminal sections 41. Note that the strain gauge 2 has no dummy pattern.

The terminal sections 44 are respectively electrically connected to both end portions of the resistor 30. The terminal sections 44 are a pair of electrodes for externally outputting a change in a resistance value of the resistor 30 in accordance with strain, where for example, a flexible substrate for external connection, or the like is joined via an anisotropic conductive film.

Each terminal section 44 includes a plurality of patterns 44a in each of which the X direction is the longitudinal direction of the pattern, and that are juxtaposed in the Y direction and at predetermined intervals. Each terminal section 44 includes a pattern 44b in which the Y direction is the longitudinal direction of the pattern 44b. The patterns 44a are electrically connected to each other, via the pattern 44b.

One end portion of each pattern 44a is connected at one side of the pattern 44b in the longitudinal direction of the pattern 44b. Another end portion of each pattern 44a is open. The width of each pattern 44a is set to be narrower than the width of the resistor 30.

One end portion of each pattern 44b is connected to a given end portion of the resistor 30. The pattern 44b has any width. For example, the width of each pattern 44b can be set to be the same as the width of the resistor 30.

Between opposing terminal sections 44 that are disposed in the Y direction, the resistor 30 in which the X direction is the grid direction of the resistor, and that is patterned to be zigzagged at predetermined intervals, is disposed.

More specifically, the resistor 30 of which the grid direction is toward the same direction as the longitudinal direction of each pattern 44a is disposed with being interposed between patterns 44a opposite each other, the patterns 44a opposite each other being from among the plurality of patterns 44a that constitute one terminal section 44 and the plurality of patterns 44a that constitute another terminal section 44.

The resistor 30, as well as the plurality of patterns 44a that constitute the one terminal section 44; and the plurality of patterns 44a that constitute the another terminal section 44, are ranged in the Y direction and at regular intervals, such that the longitudinal directions of the resistor and the patterns are toward the same direction. In other words, a given space between patterns 44a that are next to each other; a given space between patterns that constitute part of the resistor 30 and that are next to each other; and a given space between a given pattern 44a and a given pattern constituting part of the resistor 30, which are next to each other, are identical.

Note that for the sake of convenience, the resistor 30 and the terminal sections 44 are expressed by different numerals. However, the resistor and the terminal sections can be integrally formed of the same material, in the same process.

As described above, for the strain gauge 2, the resistor 30 that is patterned to be zigzagged between a pair of terminal sections 44 that become electrodes, is disposed. The zigzag patterned resistor 30, as well as the plurality of patterns 44a that constitute one terminal section 44; and the plurality of patterns 44a that constitute another terminal section 44, are ranged in a predetermined direction and at regular intervals, such that the longitudinal directions of the resistor and the patterns are toward the same direction. Further, the width of the resistor 30 is the same as the width of each pattern 44a.

In such a manner, as in the first embodiment, join reliability in the case of joining a pair of terminal sections 44 to a flexible substrate or the like, via the anisotropic conductive film can be improved.

Note that in the strain gauge 2, density in the resistor 30 and the terminal sections 44 is approximately uniform. Thus, the resistor 30 and the terminal sections 44 are easily formed by etching, in comparison to the strain gauges 1, 1A, and 1B in each of which density in the resistor and the terminal sections is non-uniform.

The preferred embodiments and the like have been described above in detail, but are not limited thereto. Various modifications and alternatives to the above embodiments and the like can be made without departing from a scope set forth in the claims.

For example, the embodiments and the modifications have been described about improvement of join reliability in the case of joining a pair of terminal sections to a flexible substrate or the like, via an anisotropic conductive film. However, the electrode structure according to the present invention also has a similar effect, when an anisotropic conductive paste (ACP) is used.

This International application claims priority to Japanese Patent Application No. 2018-065346, filed Mar. 29, 2018, the contents of which are incorporated herein by reference in their entirety.

REFERENCE SIGNS LIST 1, 1A, 1B, 2 strain gauge, 10 substrate, 10a upper surface, 20 functional layer, 30 resistor, 41, 42, 43, 44 terminal section, 41a, 41b, 42a, 42b, 43a, 43b, 44a, 44b pattern, 60 cover layer

The invention claimed is:
1. A strain gauge comprising:
a flexible resin substrate;
a functional layer formed of a metal, an alloy, or a metal compound, on one surface of the substrate;
a resistor formed as a film containing Cr, CrN, and $Cr_2N$, on one surface of the functional layer; and
a pair of electrodes electrically connected to the resistor,
wherein each electrode includes a plurality of first patterns that are juxtaposed at predetermined intervals and that are electrically connected to each other,
wherein a plurality of second patterns of which longitudinal directions are toward a same direction as a longitudinal direction of each of the first patterns are disposed between opposing electrodes,
wherein the plurality of second patterns are electrically floating dummy patterns, and wherein the plurality of second patterns of which the longitudinal directions are toward a same direction as the longitudinal direction of each first pattern are disposed, the second patterns being interposed between first patterns opposite each other, among the first patterns, and the first patterns opposite each other being from among given first patterns that constitute one of the electrodes and given first patterns that constitute another electrode.

2. The strain gauge according to claim 1, wherein a width of each first pattern is same as a width of each second pattern, and
wherein a space between first patterns that are next to each other is same as a space between second patterns that are next to each other.

3. A strain gauge comprising:
a flexible resin substrate;
a functional layer formed of a metal, an alloy, or a metal compound, on one surface of the substrate;
a resistor formed as a film containing Cr, CrN, and $Cr_2N$, on one surface of the functional layer; and
a pair of electrodes electrically connected to the resistor,
wherein each electrode includes a plurality of first patterns that are juxtaposed at predetermined intervals and that are electrically connected to each other,
wherein a plurality of second patterns of which longitudinal directions are toward a same direction as a longitudinal direction of each of the first patterns are disposed between opposing electrodes,
wherein the plurality of second patterns are a zigzag pattern that constitutes the resistor, and
wherein the plurality of second patterns of which the longitudinal directions are toward a same direction as the longitudinal direction of each first pattern are disposed, the second patterns being interposed between first patterns opposite each other, among the first patterns, and the first patterns opposite each other being from among given first patterns that constitute one of the electrodes and given first patterns that constitute another electrode.

4. The strain gauge according to claim 1, wherein the longitudinal direction of each of the first patterns and the second patterns is parallel to a grid direction of the resistor.

5. A strain gauge comprising:
a flexible resin substrate;
a functional layer formed of a metal, an alloy, or a metal compound, on one surface of the substrate;
a resistor formed as a film containing Cr, CrN, and $Cr_2N$, on one surface of the functional layer; and
a pair of electrodes electrically connected to the resistor,
wherein each electrode includes a plurality of first patterns that are juxtaposed at predetermined intervals and that are electrically connected to each other,
wherein a plurality of second patterns of which longitudinal directions are toward a same direction as a longitudinal direction of each of the first patterns are disposed between opposing electrodes,
wherein a width of each first pattern is same as a width of each second pattern,
wherein a space between first patterns that are next to each other is same as a space between second patterns that are next to each other, and
wherein the plurality of second patterns of which the longitudinal directions are toward a same direction as the longitudinal direction of each first pattern are disposed, each of the second patterns being interposed between end portions of opposing first patterns, the opposing first patterns being from among given first patterns that constitute one of the electrodes and given first patterns that constitute another electrode.

6. The strain gauge according to claim 5, wherein the longitudinal direction of each of the first patterns and the second patterns is perpendicular to a grid direction of the resistor.

7. The strain gauge according to claim 1, wherein the film of the resistor is formed with alpha-chromium as a main component.

8. The strain gauge according to claim 7, wherein the resistor includes alpha-chromium at 80% by weight or more.

9. The strain gauge according to claim 1, wherein the functional layer includes a function of promoting crystal growth of the resistor.

10. The strain gauge according to claim 3, wherein a width of each first pattern is same as a width of each second pattern, and
wherein a space between first patterns that are next to each other is same as a space between second patterns that are next to each other.

11. The strain gauge according to claim 3, wherein the longitudinal direction of each of the first patterns and the second patterns is parallel to a grid direction of the resistor.

12. The strain gauge according to claim 3, wherein the film of the resistor is formed with alpha-chromium as a main component.

13. The strain gauge according to claim 12, wherein the resistor includes alpha-chromium at 80% by weight or more.

14. The strain gauge according to claim 3, wherein the functional layer includes a function of promoting crystal growth of the resistor.

15. The strain gauge according to claim 5, wherein the plurality of second patterns are electrically floating dummy patterns.

16. The strain gauge according to claim 5, wherein the film of the resistor is formed with alpha-chromium as a main component.

17. The strain gauge according to claim 16, wherein the resistor includes alpha-chromium at 80% by weight or more.

18. The strain gauge according to claim 5, wherein the functional layer includes a function of promoting crystal growth of the resistor.

* * * * *